(12) United States Patent
Harvey et al.

(10) Patent No.: US 7,710,121 B2
(45) Date of Patent: May 4, 2010

(54) ELECTRICAL CONNECTOR INTEGRITY TESTER

(75) Inventors: Richard W. Harvey, Logansport, IN (US); Robert James McGaughey, Bringhurst, IN (US)

(73) Assignee: Federal Mogul Corporation, Southfield, MI (US)

( * ) Notice: Subject to any disclaimer, the term of this patent is extended or adjusted under 35 U.S.C. 154(b) by 232 days.

(21) Appl. No.: 11/959,552

(22) Filed: Dec. 19, 2007

(65) Prior Publication Data

US 2008/0204032 A1 Aug. 28, 2008

Related U.S. Application Data

(60) Provisional application No. 60/891,947, filed on Feb. 28, 2007.

(51) Int. Cl.
*G01R 31/00* (2006.01)
*F02P 17/00* (2006.01)
*G01M 15/04* (2006.01)

(52) U.S. Cl. .................. 324/503; 324/383; 73/114.38; 73/114.41; 702/58

(58) Field of Classification Search .................. 324/503, 324/383; 73/114.38, 114.41; 702/58
See application file for complete search history.

(56) References Cited

U.S. PATENT DOCUMENTS

| 3,646,438 | A | 2/1972 | Staff |
|---|---|---|---|
| 4,207,611 | A | 6/1980 | Gordon |
| 4,333,338 | A | 6/1982 | Patey |
| 4,567,756 | A | 2/1986 | Colborn |
| 4,764,727 | A | 8/1988 | McConchie, Sr. |
| 4,859,953 | A | 8/1989 | Young et al. |
| 4,884,033 | A | 11/1989 | McConchie, Sr. |
| 5,066,919 | A | 11/1991 | Klassen et al. |
| 5,446,389 | A | 8/1995 | Lenz |
| 5,459,664 | A | 10/1995 | Buckalew |
| 5,499,538 | A * | 3/1996 | Glidewell et al. ........ 73/114.41 |
| 5,602,482 | A | 2/1997 | Gutierrez |
| 5,852,796 | A | 12/1998 | Stepanenko, Jr. |
| 5,875,413 | A | 2/1999 | Vinci |
| 5,903,156 | A | 5/1999 | Matsumaru et al. |
| 5,935,180 | A | 8/1999 | Fieramosca et al. |
| 6,043,661 | A | 3/2000 | Gutierrez |
| 6,055,468 | A | 4/2000 | Kaman et al. |
| 6,134,488 | A * | 10/2000 | Sasaki et al. .................. 701/31 |
| 6,222,374 | B1 | 4/2001 | Shoemaker |
| 6,237,400 | B1 | 5/2001 | Takakura et al. |
| 6,323,656 | B2 | 11/2001 | Shoemaker |
| 6,901,791 | B1 | 6/2005 | Frenz |
| 6,941,785 | B2 | 9/2005 | Haynes |

(Continued)

FOREIGN PATENT DOCUMENTS

| EP | 0039122 | A2 | 4/1981 |
|---|---|---|---|
| JP | 2004138437 | | 5/2004 |

*Primary Examiner*—Amy He
(74) *Attorney, Agent, or Firm*—Robert L. Stearns; Dickinson Wright PLLC

(57) ABSTRACT

This invention provides an electric fuel pump tester that allows a technician to simulate the real-life operation of the electrical system of the vehicle, i.e., when the fuel pump is installed. The present invention provides a tester that includes a load that is similar to that of an installed fuel pump. In this manner, a technician may monitor simulated real-life operation of the vehicle's electrical system.

20 Claims, 2 Drawing Sheets

U.S. PATENT DOCUMENTS

| | | |
|---|---|---|
| 7,057,394 B1 | 6/2006 | Bell et al. |
| 7,120,563 B2 | 10/2006 | Bechhoefer et al. |
| 7,523,652 B2 * | 4/2009 | Baker et al. .............. 73/114.41 |
| 2005/0052186 A1 | 3/2005 | Grube |

* cited by examiner

ELECTRICAL CONNECTOR INTEGRITY TESTER

RELATED APPLICATIONS

This patent application claims priority to U.S. Provisional Patent Application Ser. No. 60/891,947, filed Feb. 28, 2007, which is incorporated herein by reference in its entirety.

STATEMENT REGARDING FEDERALLY SPONSORED RESEARCH

None

TECHNICAL FIELD

This invention relates generally to electric fuel pump testers and, more particularly, to a circuit for testing the electrical operating characteristics of an installed electric fuel pump.

BACKGROUND OF THE INVENTION

A common issue encountered when attempting to diagnose a problem with the operation of a vehicle's electric fuel pump is that the technician is unable to accurately and completely test the electrical operation of the fuel system. Typically, in order to test the electric operation a technician will uninstall the fuel pump from the vehicle and test the voltage at the fuel pump electrical connection on the vehicle wire harness. The standard operating voltage of an electrical fuel pump is approximately 12 Volts DC. If the technician checks the voltage at the electrical connection and it measures approximately 12 Volts DC, the technician will believe that the electrical system of the vehicle is operating properly and, thus, assume the fuel pump is defective. However, the fuel pump wire harness may measure at approximately 12 Volts DC in an unloaded state and still be defective. In some cases, a technician will replace a fuel pump in a vehicle multiple times before realizing that the electrical system of the vehicle may be the root cause of the problem.

SUMMARY OF THE INVENTION

In general terms, this invention provides an electric fuel system tester that allows a technician to simulate the real-life operation of the electrical system of the vehicle, i.e., when the fuel pump is installed. With this invention, a technician will be able to diagnose a defective electrical system, even in the situation where the electrical connection measures an acceptable voltage level. In one embodiment, an electric fuel pump testing system is provided. The system comprises a connector for connecting the system to the vehicle's electrical system, and an apparatus for measuring the voltage or resistance of the vehicle's wire harness. The system further comprises a load, for example, a light or other resistive element, that simulates the electric draw of the electric fuel pump on the vehicle's electrical system when operating properly. Finally, the system includes a display device for indicating whether the electrical system of the vehicle is operating properly.

In another embodiment, a method for testing the operation of a fuel system of a vehicle is described. The method comprises the steps of connecting a test device to the vehicle's fuel pump electrical connectors, providing a load on the electrical system of the vehicle, measuring the electric characteristics of the vehicle with the tester connected, and outputting the electric characteristics.

These and other features and advantages of this invention will become more apparent to those skilled in the art from the detailed description of a preferred embodiment. The drawings that accompany the detailed description are described below.

DETAILED DESCRIPTION OF A PREFERRED EMBODIMENT

Figure 1:
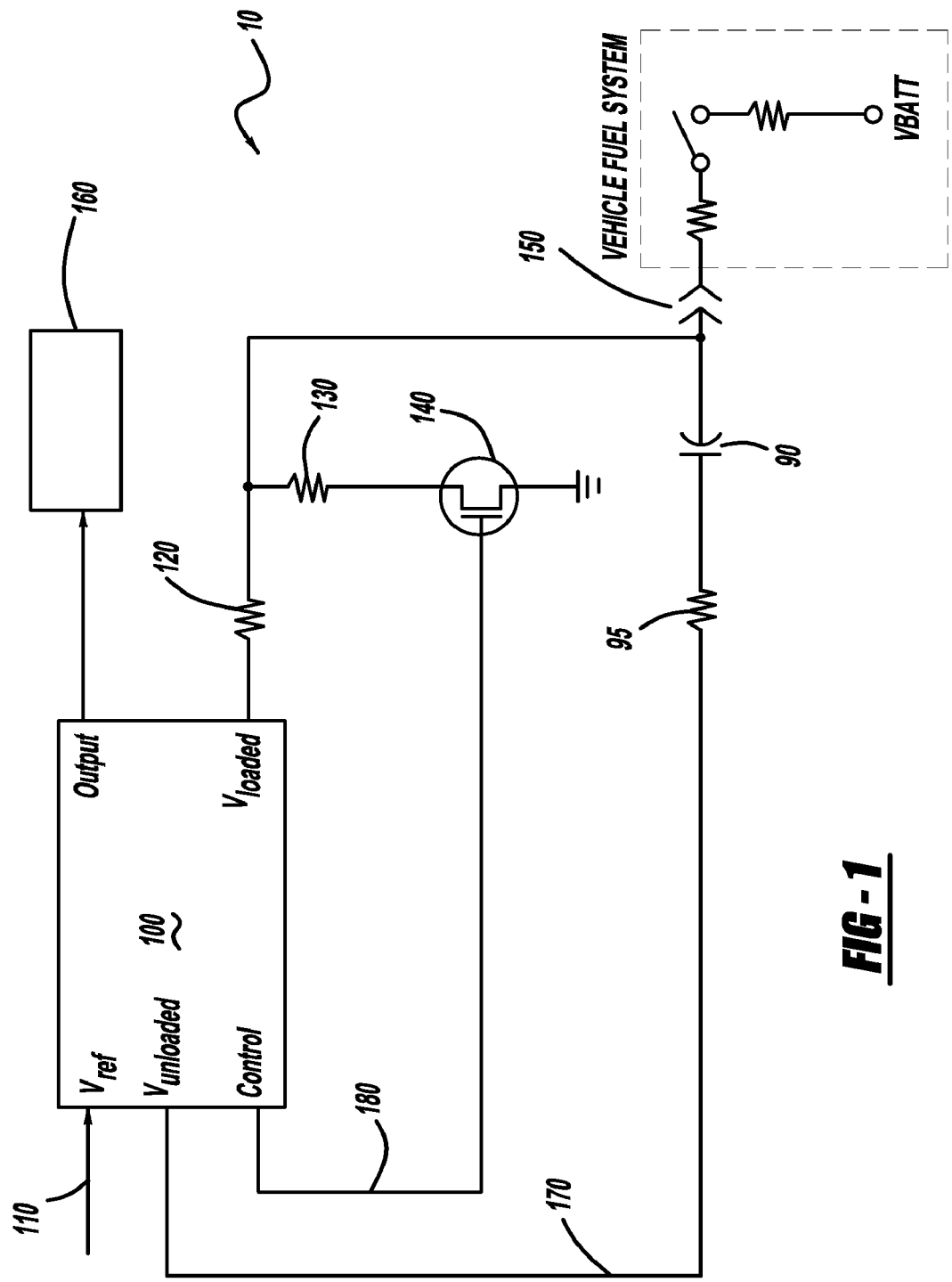
FIG. 1 is a schematic of an electric fuel pump tester according to one embodiment of the present invention.

The present invention provides a system and method for testing the real-life electrical operating characteristics of a vehicle's fuel pump system. Essentially, prior art systems and methods for testing the electrical operation of electric fuel system provide incomplete information at best, and inaccurate and faulty information at worst. In these prior art systems and methods, a technician measures the electrical supply to the fuel pump at the fuel pump wire harness connector when the fuel pump is uninstalled from the vehicle. If the supply measures approximately 12 Volts DC, the technician assumes that the electrical system of the vehicle is operating properly. However, there are a number of situations in which a technician will obtain a normal measurement in an un-installed and unloaded state, but in an installed state, when the vehicle's electrical system is loaded and the fuel pump is drawing electrical power, the vehicle will not provide the proper electrical power to the fuel pump.

In one embodiment of the present invention, an electric fuel pump testing system is provided. The system comprises a connector for connecting the system to the vehicle's electrical system. This connector is placed in-line of the vehicle electrical system at the fuel pump wire harness connector. Basically, the fuel pump is disconnected from the vehicle and the tester is connected with the same connector. The tester includes any of a number of electrical testing circuits, for example, an apparatus, for measuring the system's electrical characteristics. The system further comprises a load for simulating the electrical draw of the fuel pump on the vehicle's electrical system. In one embodiment, a standard vehicle headlight is used as the load, however any load that replicates the draw of the fuel pump may be used, for example, a resistor, a heater, or any other resistive element. The system also includes a display device for indicating whether the electrical system of the vehicle is operating properly. In one embodiment, the display device comprises two LED's or other lights, one red and the other green. If the system's electrical characteristics are within an acceptable range, the green light will be illuminated and indicate proper operation. If the system's electrical characteristics are outside of an acceptable range, the red light will be illuminated and indicate a vehicle electrical system malfunction. In another embodiment, the electrical characteristics will be output directly to the technician, for example, by an analog dial or digital read-out. The specific display device utilized in the system is irrelevant so long as the technician is able to quickly and accurately diagnose the operation of the electrical system of the vehicle.

In another embodiment of the present invention, a method for testing the operation of a fuel system of a vehicle is described. The method comprises the steps of connecting a test device to the vehicle's fuel pump electrical connectors.

The test device is configured to simulate the load of a properly operating electric fuel pump. The method also includes the step of measuring the electric characteristics of the vehicle with the tester connected. In this manner, the tester is able to measure and monitor a simulated real-life operating characteristics of the vehicle's electrical system. Finally, the method includes the step of outputting an indication of the operation of the electrical system of the vehicle.

FIG. 1 is a circuit diagram of an exemplary electrical connection testing apparatus 10 according to one embodiment of the present invention. The fuel pump is typically connected to the fuel pump power supply of the fuel system through a wire harness. In order to test the fuel system operation with the apparatus 10 of the present invention, the apparatus 10 is connected to the fuel pump power supply of the fuel system through line 150. This connection is utilized to sample the fuel system electrical characteristics, which, as illustrated in FIG. 1, is voltage. In an alternative embodiment, resistance may be sampled. The test apparatus 10 includes a microcontroller 100, e.g., a PIC16F819, or other processor programmed to perform the test method. The microcontroller 100 includes an input reference voltage—$V_{ref}$—on line 110, which is used in a comparison with the fuel system sampled voltage. In one embodiment, the electrical connection testing apparatus 10 is connected to the fuel pump power supply of the fuel system by the same connector that is used to connect to the fuel pump. In this manner, the electrical connection testing apparatus 10 essentially replaces the fuel pump from the perspective of the power supply portion of the fuel system.

In the embodiment illustrated in FIG. 1, a number of components are utilized to connect the fuel system to the microcontroller 100. A connection on line 170 through capacitor 90 and resistor 95 to the vehicle fuel system allows the microcontroller 100 to sample the voltage of the fuel system power supply in an unloaded state ($V_{unloaded}$). A voltage divider network comprising resistors 120 and 130 is utilized and connected to MOSFET 140 to provide a sample of the voltage of the fuel system power supply in a loaded state ($V_{loaded}$) to the microcontroller 100. Control line 180 is utilized to switch MOSFET 140 on and off in order to provide numerous $V_{loaded}$ values to the processor. In this manner, and as more fully described below, microcontroller 100 takes a number of voltage samples of the fuel system in both a loaded and unloaded condition in order to diagnose the operation of the fuel system. Once completed, the microcontroller outputs a signal to the output device 160. In one embodiment, the output device 160 comprises a set of two different colored LED's that either indicates a pass (e.g., turning on a green LED) or a fail (e.g., turning on a red LED). Notwithstanding this example, the exact configuration of the output device may differ (for example, a "buzzer" or other audible output device may be used, or the $V_{sample}$ measurements may be directly indicated, or some combination of different output devices may be utilized.

Figure 2:
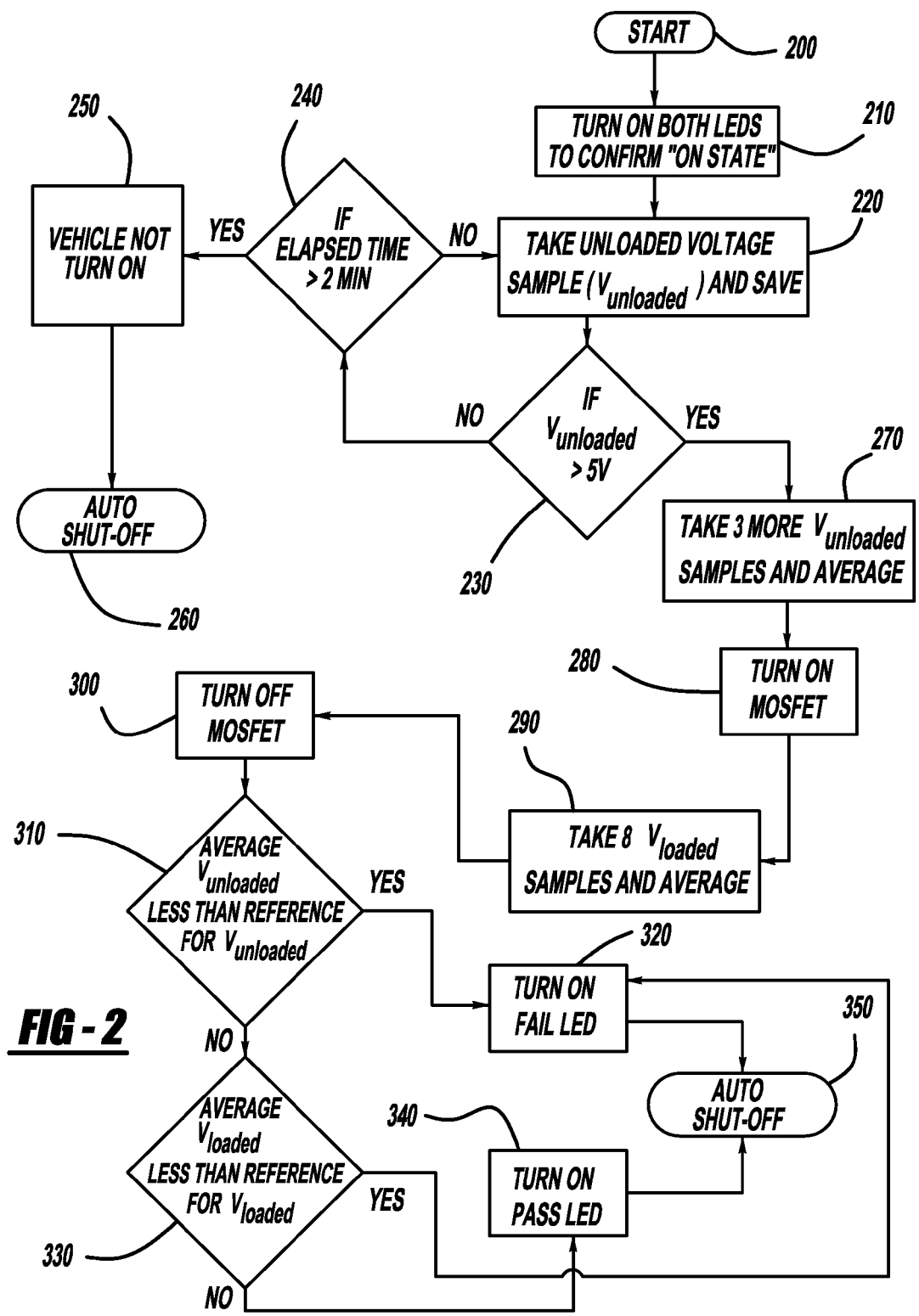
FIG. 2 is a flow chart that sets forth a method of testing the operation of an electric fuel pump according to one embodiment of the present invention.

A flow chart setting forth the steps of an exemplary method of testing the integrity of the power supply portion of an electric fuel system of a vehicle according to one embodiment of the present invention is illustrated in FIG. 2. As described above, the test apparatus is connected to the power supply of the fuel system in place of the fuel pump and the vehicle is turned on. At step 200, the test apparatus is turned on. The test apparatus indicates the on-state at step 210, e.g., by illuminating the two LED's described above. The test apparatus samples and stores the unloaded voltage ($V_{unloaded}$) of the fuel system at step 220. If the sampled $V_{unloaded}$ is below 5V, or any other voltage threshold set by the tester, at step 230, the method determines if the elapsed time since the test apparatus has been turned on is less than two minutes at step 240. If so, the method returns to step 220 described above. If the elapsed time is greater than two minutes, the method passes on to step 250 to indicate that the fuel system is not providing adequate power to the fuel pump (for example, the vehicle ignition is in the off-state) and at step 260 the test apparatus enters a sleep mode or is shut off. The lack of adequate power that is determined at step 250 may be indicated to the tester by the flashing of the LED's, a buzzer or similar audible signal, or any other fault indicator.

If, at step 230, the unloaded voltage sample ($V_{unloaded}$) is greater than the voltage threshold, (5V in the illustrated embodiment), the test apparatus begins the integrity test method. In the illustrated embodiment, the test method samples $V_{unloaded}$ three more times and then calculates the time average of the samples at step 270. This average $V_{unloaded}$ value is stored for later use, as described below. At step 280, a load is applied to the tester, e.g., by turning on the MOSFET 140 as illustrated in the embodiment of FIG. 1. Once the MOSFET 140 is turned on, the test apparatus samples the loaded voltage of the fuel system ($V_{loaded}$) at step 290. A total of eight $V_{loaded}$ samples are taken and averaged during this step. Once the test apparatus determines that eight $V_{loaded}$ samples have been taken, the MOSFET 140 is turned off at step 300. At step 310, the average of the $V_{unloaded}$ samples is compared to a reference unloaded voltage threshold. If the average of the $V_{unloaded}$ samples is less than the reference unloaded voltage, at step 320 a system failure is indicated, e.g., by turning on the red LED. The method then proceeds to step 350 and the test apparatus enters a sleep mode or is automatically turned off. If the average of the $V_{unloaded}$ samples is greater than the reference voltage at step 310, the method proceeds to step 330. During step 330, the average of the $V_{loaded}$ samples is compared to a reference loaded voltage threshold. If the average of the $V_{loaded}$ samples is less than the reference loaded voltage threshold, a system failure is indicated at step 320 and the test apparatus enters a sleep mode or is automatically turned off at step 350. In the alternative, if the average of the $V_{loaded}$ samples is greater than the reference loaded voltage threshold, a system pass is indicated at step 340, e.g., by turning on the green LED. The method then proceeds to step 350 and the test apparatus is automatically turned off.

The system and method illustrated in the Figures discussed above may be modified and still fall within the scope of the present invention. For example, the electrical characteristic that is utilized as the basis for the test in the described embodiments is the fuel system voltage, however other characteristics, e.g., current, could easily substitute for voltage. Additionally, the described embodiment utilizes the minimum of a certain number of voltage samples to compare to the reference voltage, but other measures of the electrical characteristics may be used instead (for example, only one voltage sample may be used or an average voltage for a certain period of time, a maximum sample, etc.). In another embodiment, the load of the test apparatus may be made variable such that the test apparatus may be compatible with a plurality of different fuel systems, or the fuel system may be tested under different operating conditions. This load variability may be done manually by means the testing personnel or the test apparatus may include a number of different settings (e.g., indicating the type of fuel system to be tested, or idle speed/wide open throttle/etc.) that automatically adjust the load. In yet another embodiment, the test apparatus may utilize wireless communication (RF or similar) to communicate with the test personnel. In this embodiment, for example, the test apparatus may be composed of two separate components—the first a load simulation portion and, the second, a output display—that communicate with one another wirelessly. In this manner, the test personnel may be outside of the immediate proximity of the fuel system and still be capable of testing its operation.

The foregoing invention has been described in accordance with the relevant legal standards, thus the description is exemplary rather than limiting in nature. Variations and modifications to the disclosed embodiment may become apparent to those skilled in the art and do come within the scope of the invention. Accordingly, the scope of legal protection afforded this invention can only be determined by studying the following claims.

We claim:

1. A method for testing the operation of a fuel system that utilizes an electric fuel pump, comprising:
   disconnecting an electric fuel pump from a power supply of a fuel system;
   connecting a test apparatus to said power supply of said fuel system;
   powering on said fuel system;
   providing a test load to said power supply of said fuel system by said test apparatus, said test load approximating a load of said electric fuel pump during operation;
   sampling an electrical characteristic of said power supply of said fuel system; and
   comparing said electrical characteristic to a reference characteristic.

2. The method of claim 1, wherein said electrical characteristic comprises a voltage of said power supply of said fuel system.

3. The method of claim 1, wherein said electrical characteristic comprises a minimum voltage of a plurality of sampled voltages.

4. The method of claim 1, further comprising the steps of determining whether said fuel system is powered on and, if said fuel system is not powered on, providing a system off indication.

5. The method of claim 4, wherein said electrical characteristic comprises a voltage of said fuel system.

6. The method of claim 4, wherein said electrical characteristic comprises a minimum voltage of a plurality of sampled voltages.

7. The method of claim 1, further comprising the step of providing a second test load to said fuel system by said test apparatus, said second test load approximating a second load of said electric fuel pump during operation.

8. The method of claim 7, wherein said electrical characteristic comprises a voltage of said fuel system.

9. The method of claim 7, wherein said electrical characteristic comprises a minimum voltage of a plurality of sampled voltages.

10. The method of claim 7, further comprising the steps of determining whether said fuel system is powered on and, if said fuel system is not powered on, providing a system off indication.

11. A system for testing the operation of a fuel system that utilizes an electric fuel pump, comprising:
    a connector, said connector configured to mate with a power supply of a fuel system;
    a load portion operably connected to said connector, said load portion being configured to approximate a test load of an electric fuel pump during operation;
    a processor operably connected to said load portion and said connector, said processor configured to:
        sample an electrical characteristic of said power supply of said fuel system, and
        compare said electrical characteristic to a reference characteristic to determine a test result; and
    an output device operably connected to said processor, said output device configured to output an indication of said test result.

12. The system of claim 11, wherein said electrical characteristic comprises a voltage of said power supply of said fuel system.

13. The system of claim 11, wherein said electrical characteristic comprises a minimum voltage of a plurality of sampled voltages.

14. The system of claim 11, wherein said processor is further configured to determine whether said fuel system is powered on and said output device is further configured to, if said fuel system is not powered on, provide a system error indication.

15. The system of claim 14, wherein said electrical characteristic comprises a voltage of said power supply of said fuel system.

16. The system of claim 14, wherein said electrical characteristic comprises a minimum voltage of a plurality of sampled voltages.

17. The system of claim 11, wherein said load portion is further configured to provide a second test load, said second test load approximating a second load of said electric fuel pump during operation.

18. The system of claim 17, wherein said electrical characteristic comprises a voltage of said power supply of said fuel system.

19. The method of claim 17, wherein said electrical characteristic comprises a minimum voltage of a plurality of sampled voltages.

20. The method of claim 17, wherein said processor is further configured to determine whether said fuel system is powered on and said output device is further configured to, if said fuel system is not powered on, provide a system error indication.

* * * * *